(12) United States Patent
Ayotte et al.

(10) Patent No.: US 9,177,931 B2
(45) Date of Patent: Nov. 3, 2015

(54) REDUCING THERMAL ENERGY TRANSFER DURING CHIP-JOIN PROCESSING

(71) Applicant: International Business Machines Corporation, Armonk, NY (US)

(72) Inventors: Stephen P. Ayotte, Bristol, VT (US); Sebastien Quesnel, Granby (CA); Glen E. Richard, Burlington, VT (US); Timothy D. Sullivan, Underhill, VT (US); Timothy M. Sullivan, Essex, VT (US)

(73) Assignee: GLOBALFOUNDRIES U.S. 2 LLC, Hopewell Junction, NY (US)

( * ) Notice: Subject to any disclaimer, the term of this patent is extended or adjusted under 35 U.S.C. 154(b) by 8 days.

(21) Appl. No.: 14/191,857

(22) Filed: Feb. 27, 2014

(65) Prior Publication Data

US 2015/0243618 A1    Aug. 27, 2015

(51) Int. Cl.
*H01L 29/15* (2006.01)
*H01L 23/00* (2006.01)
*H01L 23/367* (2006.01)
*H01L 23/373* (2006.01)

(52) U.S. Cl.
CPC .............. *H01L 24/13* (2013.01); *H01L 23/367* (2013.01); *H01L 23/373* (2013.01); *H01L 24/11* (2013.01); *H01L 2224/13023* (2013.01); *H01L 2224/8121* (2013.01)

(58) Field of Classification Search
CPC .......... H01L 2224/13006; H01L 2224/13022; H01L 2224/16227; H01L 24/05; H01L 24/13; H01L 2924/01327
USPC .................... 257/77, 737, 738, 748
See application file for complete search history.

(56) References Cited

U.S. PATENT DOCUMENTS

| | | | |
|---|---|---|---|
| 5,744,865 A | 4/1998 | Jeng et al. | |
| 6,288,376 B1 | 9/2001 | Tsumura | |
| 6,396,156 B1 * | 5/2002 | Tang et al. | 257/779 |
| 7,893,534 B2 | 2/2011 | Hirano et al. | |
| 8,026,613 B2 | 9/2011 | Fogel et al. | |
| 8,254,140 B2 | 8/2012 | Lee et al. | |
| 8,454,845 B2 | 6/2013 | Dutta | |
| 8,455,918 B2 | 6/2013 | Adachi et al. | |

(Continued)

FOREIGN PATENT DOCUMENTS

CN         101431047 B    3/2011

*Primary Examiner* — Cheung Lee
*Assistant Examiner* — Frederick B Hargrove
(74) *Attorney, Agent, or Firm* — Gibb & Riley, LLC; Anthony Canale (57) ABSTRACT

Embodiments of the present invention provide a semiconductor structure and method to reduce thermal energy transfer during chip-join processing. In certain embodiments, the semiconductor structure comprises a thermal insulating element formed under a first conductor. The semiconductor structure also comprises a solder bump formed over the first conductor. The semiconductor structure further comprises a second conductor formed on a side of the thermal insulating element and in electrical communication with the first conductor and a third conductor. The third conductor is formed to be in thermal or electrical communication with the thermal insulating element. The thermal insulating element includes thermal insulating material and the thermal insulating element is structured to reduce thermal energy transfer during a chip-join process from the solder bump to a metal level included in the semiconductor structure.

19 Claims, 6 Drawing Sheets

(56) References Cited

U.S. PATENT DOCUMENTS

| | | |
|---|---|---|
| 8,455,994 B2 | 6/2013 | Iihola et al. |
| 8,456,009 B2 | 6/2013 | Su et al. |
| 2003/0153171 A1* | 8/2003 | Kim .............................. 438/612 |
| 2006/0072296 A1 | 4/2006 | Mays |
| 2009/0273081 A1 | 11/2009 | Daubenspeck et al. |
| 2010/0096754 A1* | 4/2010 | Lee et al. ...................... 257/738 |
| 2010/0130001 A1 | 5/2010 | Noguchi |
| 2010/0164096 A1* | 7/2010 | Daubenspeck et al. ....... 257/737 |
| 2011/0108992 A1 | 5/2011 | Chanda et al. |
| 2012/0001200 A1* | 1/2012 | Ikoshi et al. .................... 257/77 |
| 2014/0070402 A1* | 3/2014 | Chuang et al. ................ 257/737 |

\* cited by examiner

REDUCING THERMAL ENERGY TRANSFER DURING CHIP-JOIN PROCESSING

FIELD OF THE INVENTION

The present invention relates generally to a semiconductor structure and method, and more specifically to a structure and method for reducing thermal energy transfer during chip-join processing.

BACKGROUND OF THE INVENTION

Semiconductor manufacturing process is typically separated into two major stages: a front-end process stage and a back-end-of-line (hereinafter "BEOL") process stage. The front-end process refers to the formation of electric devices, such as transistors, and/or electric components, such as resistors and capacitors, on a semiconductor substrate. On the other hand, the BEOL process refers to the formation of metal interconnections between various electric devices and electric components in order to implement a circuitry as designed. Usually, layers of the metal interconnections are insulated by insulating dielectric materials, such as silicon oxide or silicate glass.

Flip chip packaging, also known as controlled collapse chip connection (hereinafter "C4"), is a method for interconnecting semiconductor devices, such as integrated circuit chips and micro-electromechanical systems, to external circuitry with solder bumps that have been deposited onto the chip pads. The solder bumps are deposited on the chip pads on the top side of the wafer/substrate during the final BEOL wafer/substrate processing step. To mount the chip to external circuitry (e.g., a circuit board or another chip or wafer), it is flipped over so that its top side faces down, and aligned so that its pads align with matching pads on the external circuit, and then the solder is flowed to complete the interconnect. Note, that this is in contrast to wire bonding, in which the chip is mounted upright and the wires are used to interconnect the chip pads to external circuitry.

Conventional reflow ovens are utilized for chip joining, wherein components of the chip assembly, such as the chip, solder bumps, and laminate substrate, are simultaneously subjected to a temperature in excess of 240° C. for several minutes. Silicon and composite materials included in the laminate substrate have very different coefficients of thermal expansion (hereinafter "CTE"). Thermal expansion refers to the tendency of matter to change in volume in response to a change in temperature. The CTE of a material is the fractional increase in the length per unit rise in temperature. After solder bumps have melted and joined the chip to the substrate they are allowed to cool to room temperature.

However, in doing so, the substrate shrinks more than the chip, which causes the assembly's outermost solder joints to experience shear stress proportional to the difference in the displacements of the silicon and the substrate. When the chips are large enough, the shear stress can deform solder bumps as well as cause the solder to tear from the chip. In the same vein, shear stress can cause the solder joints to crack the chip near its top, which can result in the breaking of wiring layers and/or chip failure. A solution is to use induction heating conducted at an appropriate frequency and time to melt the solder bump while not directly heating either the silicon or the substrate.

Short induction durations are preferable, since some heat will escape from the heated solder bump into both the chip and the substrate by thermal conduction. As the induction duration increases, the amount of heat absorbed by the chip and the substrate increases, which can result in undesirable thermal expansion therein. To address undesirable thermal expansion, shorter induction durations may be performed to create adiabatic conditions, wherein a reduced amount of heat is absorbed by either the chip and/or the substrate. However, as the induction duration decreases, the amount of power required increases, which may increase manufacturing costs.

SUMMARY

Embodiments of the present invention provide a semiconductor structure and method to reduce thermal energy transfer during chip-join processing. In certain embodiments, the semiconductor structure comprises a thermal insulating element formed under a first conductor. The semiconductor structure also comprises a solder bump formed over the first conductor. The semiconductor structure further comprises a second conductor formed on a side of the thermal insulating element and in electrical communication with the first conductor and a third conductor. Wherein the third conductor is formed to be in thermal or electrical communication with the thermal insulating element; the thermal insulating includes thermal insulating material; and the thermal insulating element is structured to reduce thermal energy transfer during a chip-join process from the solder bump to a metal level included in the semiconductor structure.

DETAILED DESCRIPTION

Detailed embodiments of the claimed structures and methods are disclosed herein. The method steps described below do not form a complete process flow for manufacturing integrated circuits. The present embodiments can be practiced in conjunction with the integrated circuit fabrication techniques currently used in the art, and only so much of the commonly practiced process steps are included as are necessary for an understanding of the described embodiments. The Figures represent cross-sectional portions of a semiconductor chip or a substrate during fabrication and are not drawn to scale but instead are drawn to illustrate the features of the described embodiments. Specific structural and functional details disclosed herein are not to be interpreted as limiting but merely as a representative basis for teaching one skilled in the art to variously employ the methods and structures of the present disclosure.

For purposes of the description hereinafter, the terms "upper", "lower", "right", "left", "vertical", "horizontal", "top", "bottom", and derivatives thereof shall relate to the disclosed structures and methods, as oriented in the drawing Figures. The terms "overlying", "atop", "over", "on", "positioned on", or "positioned atop" mean that a first element is present on a second element wherein intervening elements, such as an interface structure, may be present between the first element and the second element. The term "direct contact" means that a first element and a second element are connected without any intermediary conducting, insulating, or semiconductor layers at the interface of the two elements.

Flip chip packaging, also known as controlled collapse chip connection (hereinafter "C4"), is a method for interconnecting semiconductor devices, such as integrated circuit chips and micro-electromechanical systems, to external circuitry with solder bumps that have been deposited onto the chip pads. The solder bumps are deposited on the chip pads on the top side of the wafer/substrate during the final BEOL wafer/substrate processing step. To mount the chip to external circuitry (e.g., a circuit board or another chip or wafer), it is flipped over so that its top side faces down, and aligned so that its pads align with matching pads on the external circuit, and then the solder is flowed to complete the interconnect. Note, that this is in contrast to wire bonding, in which the chip is mounted upright and wires are used to interconnect the chip pads to external circuitry.

Conventional reflow ovens are used to interconnect chips, wherein components of the chip assembly, such as the chip, solder bumps, and laminate substrate, are simultaneously subjected to a temperature in excess of 240° C. for several minutes. Silicon and composite materials included in the laminate substrate have very different coefficients of thermal expansion (CTE). Thermal expansion refers to the tendency of matter to change in volume in response to a change in temperature. The CTE of a material is the fractional increase in the length per unit rise in temperature. After solder bumps have melted and joined the chip to the substrate they are allowed to cool to room temperature.

However, in doing so, the substrate shrinks more than the chip, which causes the assembly's outermost solder joints to experience shear stress proportional to the difference in the displacements of the silicon and the substrate. Shear stress is defined as the component of stress that is co-planar with a material's cross section and arises from the force vector component that is parallel to the cross section. On the other hand, normal stress arises from the force vector component that is parallel or anti-parallel to the cross section on which it acts. When the chips are large enough, the shear stress can deform solder bumps as well as cause the solder to tear from the chip. In the same vein, shear stress can cause the chip to crack near its top, which can result in the breaking of wiring layers and/or chip failure. Short induction durations are preferable, since some heat will escape from the heated solder bump into both the chip and the substrate by thermal conduction. As the induction duration increases, the amount of heat absorbed by the chip and the substrate increases, which can result in undesirable thermal expansion therein.

To address undesirable thermal expansion rates, embodiments of the present invention include a thermal insulating structure between the solder bump, substrate, and/or chip to enhance the thermal resistance of the assembly. In other embodiments, the thermal insulating structure reduces the rate of heat transfer to the silicon and the substrate, which can limit thermal expansion, permit longer induction durations, and/or lower the amount of power required for the chip-join process. The thermal insulating structure can also be utilized to attach solder bumps to chips, either directly through a conducting structure, such as a pillar, or directly to the top metallization layer through a ball-limiting metallization. In an embodiment, the present invention seeks to provide a path for the dissipation of heat between the solder bump and the chip below. In other embodiments, induction heating may be utilized to melt solder bumps in place of a reflow oven, wherein induction and/or a magnetic field is utilized to heat solder bumps and not the plastic laminate or silicon of the chip. Here shorter times are desired when heating solder bumps using induction heating, since some thermal energy may escape through one side of the laminate and through the other side of the silicon.

Figure 1:
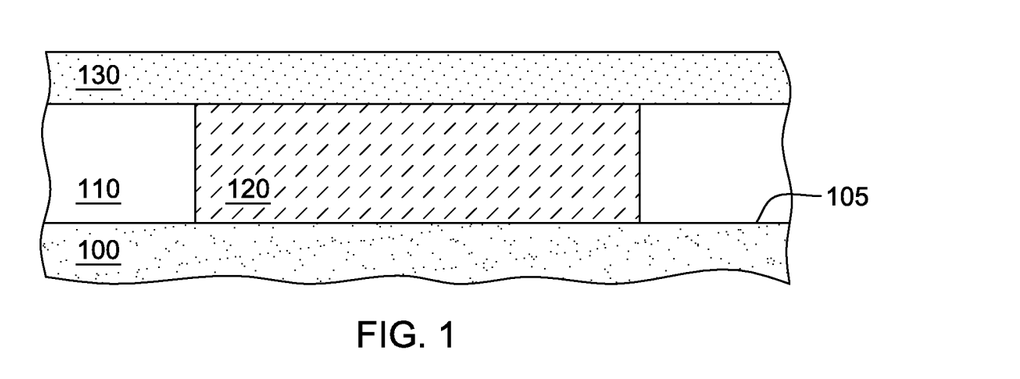
FIG. 1 illustrates a cross-sectional view of principal parts in the fabrication of a semiconductor structure, in accordance with an embodiment of the present invention.

Sequential steps of an exemplary embodiment of a semiconductor structure having reduced heat transfer capabilities are described below with respect to the schematic illustrations of FIGS. 1-8. Similar reference numerals denote similar features. Referring to FIG. 1, a plurality of semiconductor elements, such as integrated circuitry (not shown), may be fabricated on semiconductor wafer 100. Layer 110 is formed on top surface 105 of wafer 100 using conventional processes, such as chemical vapor deposition (hereinafter "CVD"). In an embodiment, wafer 100 may include additional layers formed thereon than depicted and layer 110 is formed on the additional layers.

Figure 2A:
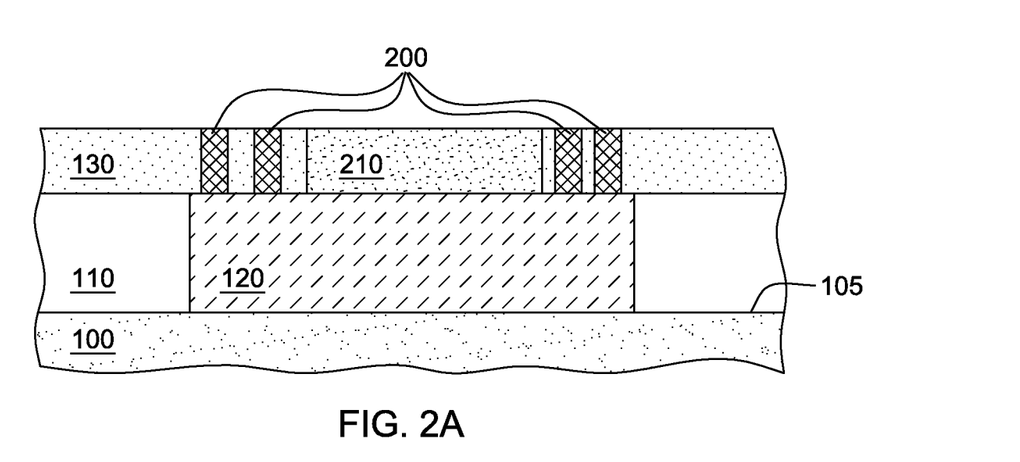
FIG. 2A is a cross-sectional view of principal parts in the fabrication of a semiconductor structure continued from FIG. 1, in accordance with an embodiment of the present invention.
Figure 2B:
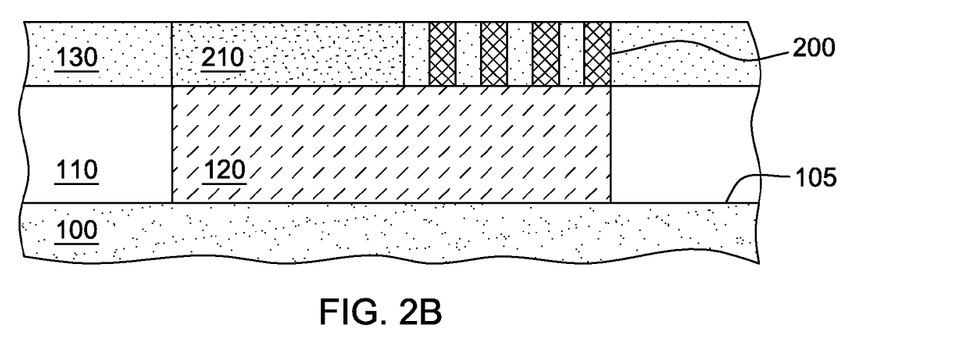
FIG. 2B is a cross-sectional view of principal parts in the fabrication of a semiconductor structure continued from FIG. 1, in accordance with an embodiment of the present invention.

Layer 110 includes semiconductor oxide material, such as silicon dioxide (hereinafter "SiO2"). Photoresist may be applied to layer 110, a cavity etched, and conductive material, such as copper, may be deposited therein using conventional processes, such as CVD, to form conductor 120. Excess material can be removed from layer 110 and conductor 120 using a conventional process, such as chemical-mechanical planarization (hereinafter "CMP"). Layer 130, which includes semiconductor oxide material, is formed on layer 110 and conductor 120 using conventional processes. The structure of FIG. 1 may include a metal level comprising conductor 120. The metal level may be formed between substrate 100 and the level containing layer 110 and conductor 120. Referring to FIG. 2A, photoresist (not shown) may be applied to layer 130, vias etched using conventional processes, and conductive material deposited therein to form conductors 200. In certain embodiments, additional or less conductors 200 may be formed in layer 130 than depicted in FIG. 2A.

To form thermal insulating element (hereinafter "TIE") 210, a cavity is etched in layer 130 below the predetermined location of the solder bump (discussed below) and insulating material deposited therein using conventional processes, in accordance with an embodiment of the present invention. Although FIG. 2A depicts the location of conductors 200 evenly spaced about TIE 210, additional configurations, such as that depicted in FIG. 2B, may also be utilized. In certain embodiments, TIE 210 includes material that has a lower thermal conductivity value than copper, which is about 401 W/(m*K), where W is watts, m is meter, and K is Kelvin.

Table 1 depicts thermal insulating materials and combinations thereof that may be utilized in embodiments of the present invention. Note that the thermal conductivity of copper is included in Table 1 as a comparison for the other materials and combinations included therein.

TABLE 1

| MATERIAL | THERMAL CONDUCTIVITY W/(m*K) |
|---|---|
| Copper (Cu) | 401 |
| Air Gap + Cu | 0.06 |
| Glasses + Cu | 3.2 |
| Laminate + Cu | 2.13 |
| Air Gap | 4.8 |
| Glass | 240 |
| Laminate | 160 |

In certain embodiments, TIE 210 includes insulating material, such as $SiO_2$, airgel, and solgel. In other embodiments, applicable thermal insulating material includes $SiO_2$, airgel, and solgel. If the insulating material includes air, a cavity is etched using conventional processes, sacrificial material is etched using an appropriate process, such as XeF2 etchant, and semiconductor oxide material is deposited to plug the initial hole. In certain embodiments, the etched cavity for TIE 210 can be an open cavity or a cavity with pillars to provide structural support (not shown).

Figure 3:
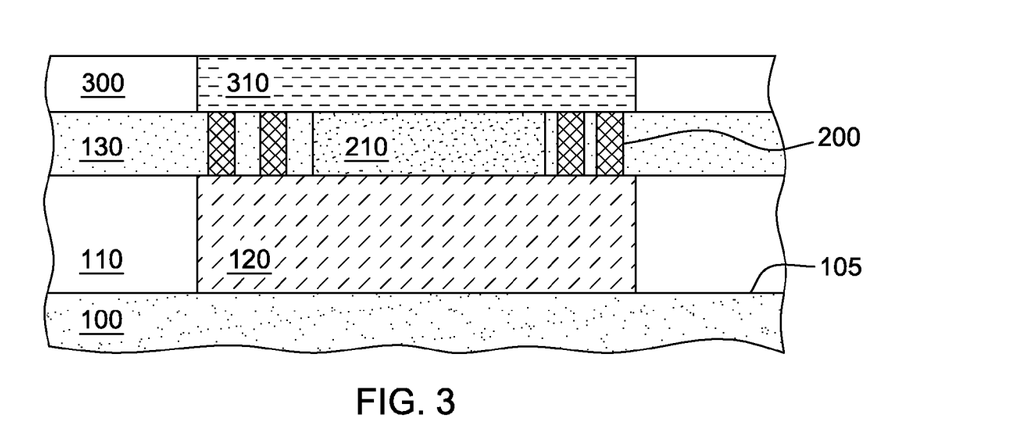
FIG. 3 is a cross-sectional view of principal parts in the fabrication of a semiconductor device/structure continued from FIG. 2, in accordance with an embodiment of the present invention.
Figure 4:
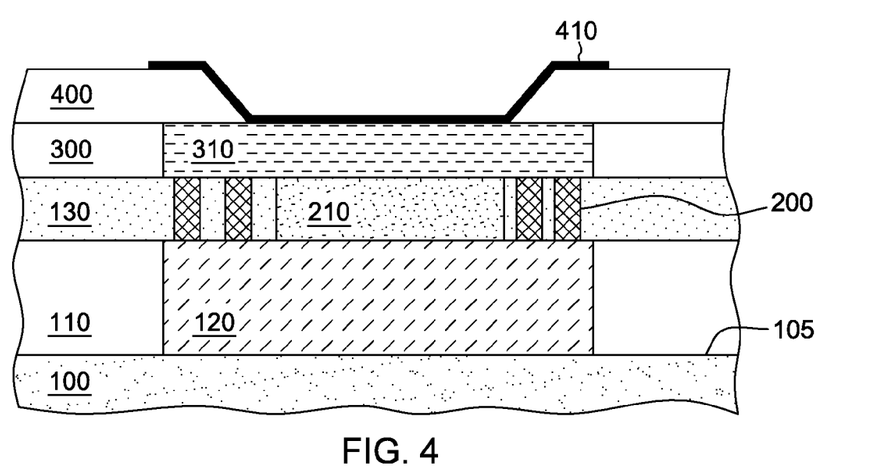
FIG. 4 is a cross-sectional view of principal parts in the fabrication of a semiconductor device/structure continued from FIG. 3, in accordance with an embodiment of the present invention.

Referring to FIG. 3, layer 300, which includes semiconductor oxide material, is formed on layer 130, conductors 200, and TIE 210 using conventional processes. A cavity is etched under the predetermined location for the C4 solder bump and conductive material, such as aluminum, nickel, and tin tungsten alloy, is deposited therein to form pad 310. Excess material can be removed from layer 300 and pad 310 using an appropriate process, such as CMP. Referring to FIG. 4, additional semiconductor oxide material is then deposited on layer 300 and pad 310 to form layer 400. Photoresist (not shown) may be deposited, a void etched, and conductive material may be deposited, for example, by CVD, therein using conventional processes to form liner 410.

Figure 5:
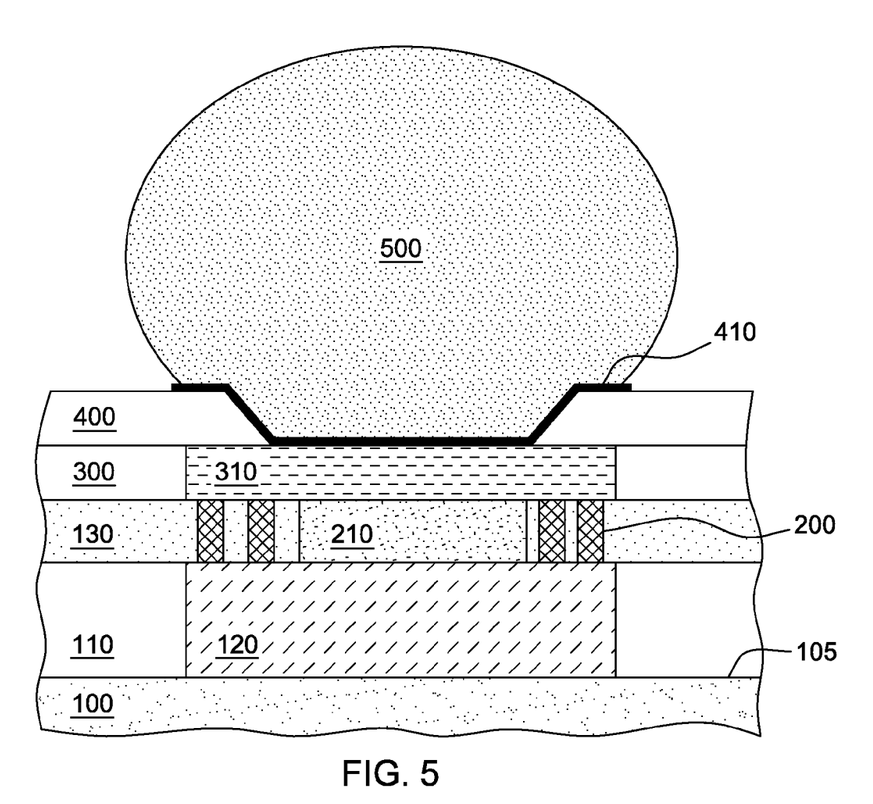
FIG. 5 is a cross-sectional view of principal parts in the fabrication of a semiconductor device/structure continued from FIG. 4, in accordance with an embodiment of the present invention.

Liner 410 includes conductive material that adheres to the solder (discussed below) and provides an electrical connection from the semiconductor structure to the solder bump (discussed below). Liner 410 is an under-bump metallization layer that provides a barrier to limit unwanted diffusion from the solder bump to the surrounding semiconductor structure. Referring to FIG. 5, solder bump 500 is formed on liner 410 using a conventional process, such as solder reflow and sputter etching. The structure depicted in FIG. 5 can be utilized in a flip-chip process (discussed below) to attach the structure to a ceramic, silicon, or organic substrate as well as a printed circuit board for electrical interconnection to a semiconductor structure. The structure of FIG. 5 may also be utilized in the formation of ball-grid array packaging.

Figure 6:
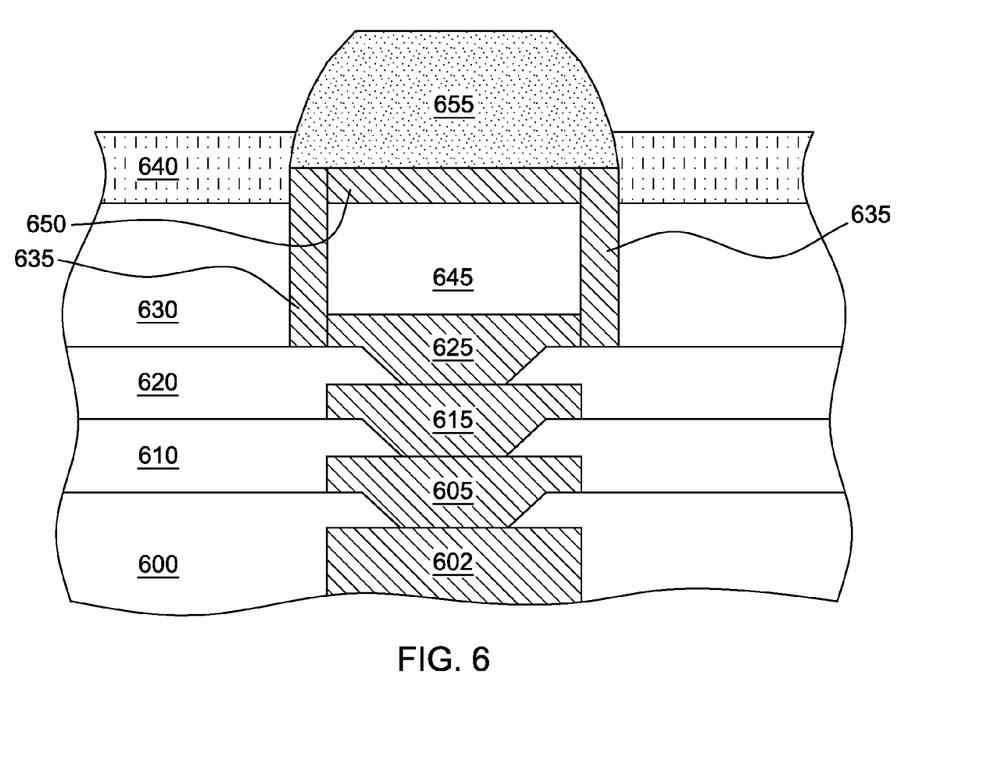
FIG. 6 illustrates a cross-sectional view of principal parts in the fabrication of a semiconductor structure, in accordance with an embodiment of the present invention.

Embodiments of the present invention described below seek to provide a TIE structure in a semiconductor laminate to address differences in CTE (discussed above). FIG. 6 illustrates a cross-sectional view of principal parts in the fabrication of a semiconductor structure, in accordance with an embodiment of the present invention. In certain embodiments, first metal layer 600 is formed on a semiconductor substrate (not shown) and includes insulating material, such as Ajinomoto build-up film (ABF).

In an embodiment, first metal layer 600 is the base layer wherein second metal layer 610, third metal layer 620, fourth metal layer 630, and layer 640 are sequentially formed.

Although not depicted, first metal layer 600, second metal layer 610, third metal layer 620, and fourth metal layer 630 may include additional electrical circuitry. In addition, although not depicted, first metal layer 600 may comprise additional or less layers formed thereon.

First metal layer 600 is formed by applying insulating material, such as an Ajinomoto build-up film (ABF), to the surface of, for example, a semiconductor substrate, in accordance with an embodiment of the present invention. Conductor 602 is formed in the ABF material by an appropriate process, such as etching, and depositing conducting material therein, for example, by CVD. Additional ABF material is deposited. Via 605 is formed in the ABF material, for example by CO2 or UV-YAG laser. Dry film resist is applied, exposed, and developed. Conductive material, such as copper, is deposited therein, for example by CVD, to form patterned circuitry and fill the via hole. The resist is stripped, the conductive material is etched, and the ABF is cured. Additional ABF material is deposited and via 615 is formed therein in a similar manner as via 605. Additional ABF material is deposited and via 625 is formed therein in a similar manner as via 605. Second metal layer 610, third metal layer 620, and fourth metal layer 630 may be formed in a similar manner as first metal layer 600 and may include similar insulating material.

To form TIE 645, a cavity can be etched or drilled beneath the predetermined location of solder bump 655. Conductors 635 are formed by a conventional process, such as electro deposition, selective to the wall of the cavity. In an embodiment, TIE 645 includes a solid material, such as sol or an air gel. Pad 650 may be formed by selectively depositing conducting material by evaporation through a mask on to layer 640 such that the location of pad 650 corresponds to the predetermined position of solder bump 655 (discussed below). Layer 640 includes insulating material, such as ABF, and may be formed on layer 630 using an appropriate process, such as curtain coating. Solder bump 655 is formed on pad 650 using an appropriate process, such as solder reflow. Solder bumps are generally formed of lead and tin.

Figure 7:
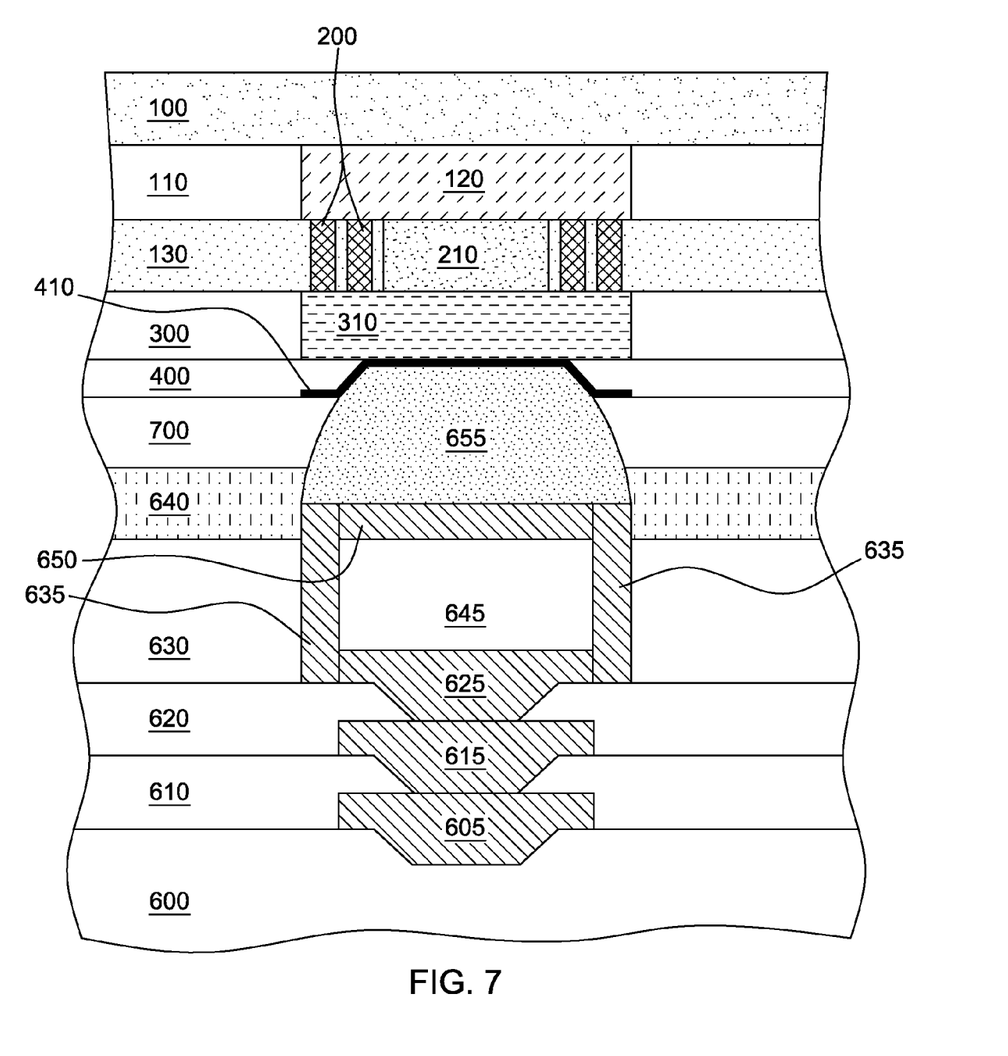
FIG. 7 is a cross-sectional view of the embodiments of FIGS. 5 and 6 joined together, in accordance with an embodiment of the present invention.

FIG. 7 is cross-sectional depiction of the embodiments of FIGS. 5 and 6 joined together, in accordance with an embodiment of the present invention. Specifically, FIG. 7 depicts a semiconductor structure wherein the embodiment depicted in FIG. 6 is flipped and joined to the embodiment depicted in FIG. 6 by solder bump 655, which is depicted as solder bump 500 in FIG. 5. Layer 700 is an underfill layer that includes an electrically-insulating adhesive, such as MasterSil 711. Here, the dual insulating properties of TIEs 210 and 645 reduce the amount of thermal energy released into the semiconductor structure as solder bump 655 is formed.

Figure 8:
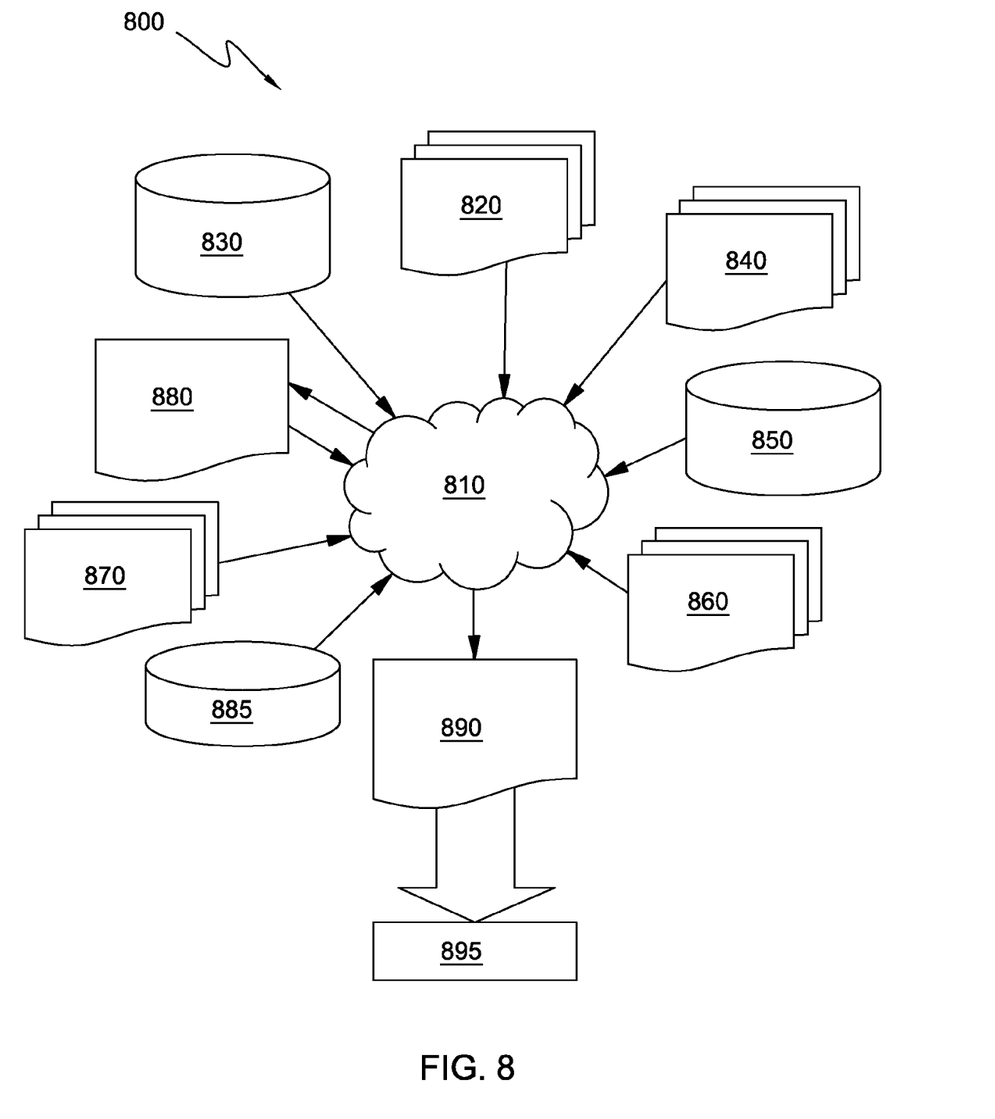
FIG. 8 is a flow diagram of a design process used in semiconductor design, manufacture, and/or test.

FIG. 8 shows a block diagram of an exemplary design flow 800 used for example, in semiconductor IC logic design, simulation, test, layout, and manufacture. Design flow 800 includes processes, machines, and/or mechanisms for processing design structures or devices to generate logically or otherwise functionally equivalent representations of the design structures and/or devices described above and shown in FIGS. 1-8. The design structures processed and/or generated by design flow 800 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array). Design flow 800 may vary depending on the type of representation being designed. For example, a design flow 800 for building an application specific IC (ASIC) may differ from a design flow 800 for designing a standard component or from a design flow 800 for instantiating the design into a programmable array, for example, a programmable gate array (PGA) or a field-programmable gate array (FPGA) offered by Altera® Inc. or Xilinx® Inc.

FIG. 8 illustrates multiple such design structures including an input design structure 820 that is preferably processed by a design process 810. Design structure 820 may be a logical simulation design structure generated and processed by design process 810 to produce a logically equivalent functional representation of a hardware device. Design structure 820 may also or alternatively comprise data and/or program instructions that when processed by design process 810 generate a functional representation of the physical structure of a hardware device. Whether representing functional and/or structural design features, design structure 820 may be generated using electronic computer-aided design (ECAD) such as implemented by a core developer/designer. When encoded on a machine-readable data transmission, gate array, or storage medium, design structure 820 may be accessed and processed by one or more hardware and/or software modules within design process 810 to simulate or otherwise functionally represent an electronic component, circuit, electronic or logic module, apparatus, device, or system such as those shown in FIGS. 1-8. As such, design structure 820 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 810 preferably employs and incorporates hardware and/or software modules for synthesizing, translating, or otherwise processing a design/simulation functional equivalent of the components, circuits, devices, or logic structures shown in FIGS. 1-8 to generate a netlist 880 which may contain design structures such as design structure 820. Netlist 880 may comprise, for example, compiled or otherwise processed data structures representing a list of wires, discrete components, logic gates, control circuits, I/O devices, models, etc. that describes the connections to other elements and circuits in an integrated circuit design. Netlist 880 may be synthesized using an iterative process in which netlist 880 is resynthesized one or more times depending on design specifications and parameters for the device. As with other design structure types described herein, netlist 880 may be recorded on a machine-readable data storage medium or programmed into a programmable gate array. The medium may be a non-volatile storage medium, such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 810 may include hardware and software modules for processing a variety of input data structure types including netlist 880. Such data structure types may reside, for example, within library elements 830 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 840, characterization data 850, verification data 860, design rules 870, and test data files 885, which may include input test patterns, output test results, and other testing information. Design process 810 may further include, for example, standard mechanical design processes, such as stress analysis, thermal analysis, mechanical event simulation, process simulation for operations, such as casting, molding, and die press forming, etc. One of ordinary skill in the art of mechanical design can appreciate the extent of possible mechanical design tools and applications used in design process 810 without deviating from the scope and spirit of the invention. Design process 810 may also include modules for performing standard circuit design processes, such as timing analysis, verification, design rule checking, place and route operations, etc.

Design process 810 employs and incorporates logic and physical design tools such as HDL compilers and simulation model build tools to process design structure 820 together with some or all of the depicted supporting data structures along with any additional mechanical design or data (if applicable), to generate a second design structure 890. Design structure 890 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 820, design structure 890 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-8. In one embodiment, design structure 890 may comprise a compiled, executable HDL simulation model that functionally simulates the devices shown in FIGS. 1-8.

Design structure 890 may also employ a data format used for the exchange of layout data of integrated circuits and/or symbolic data format (e.g. information stored in a GDSII (GDS2), GL1, OASIS, map files, or any other suitable format for storing such design data structures). Design structure 890 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-8. Design structure 890 may then proceed to a stage 895 where, for example, design structure 890 proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
    an insulating layer having a first surface and a second surface opposite the first surface;
    a thermal insulating element extending vertically through the insulating layer from the first surface to the second surface, the thermal insulating element and the insulating layer comprising different insulating materials and the thermal insulating element comprising a thermal insulating material;
    a first conductor on the second surface of the insulating layer and immediately adjacent to the thermal insulating element;
    a solder bump on the first conductor;
    a second conductor extending vertically through the insulating layer from the first surface to the second surface such that the second conductor is immediately adjacent to the first conductor and to the insulating layer and such that a portion of the insulator layer is positioned laterally between the second conductor and the thermal insulating element; and
    a third conductor on the first surface of the insulating layer and immediately adjacent to the thermal insulating element and the second conductor,
    the thermal insulating element being narrower in width than the first conductor and reducing thermal energy transfer during a chip-join process from the solder bump to a metal level in the semiconductor structure.

2. The semiconductor structure of claim 1, the thermal insulating material comprising at least one of air, airgel, and solgel.

3. The semiconductor structure of claim 1, the thermal insulating element comprising a structural support element.

4. The semiconductor structure of claim 1, further comprising:
    a conductive liner between the solder bump and the first conductor, and
    the thermal insulating element and an interface between the conductive liner and the first conductor having approximately equal widths.

5. The semiconductor structure of claim 1, the metal level being under the third conductor.

6. The semiconductor structure of claim 1, the metal level comprising the third conductor.

7. The semiconductor structure of claim 1, the first conductor comprising a terminal metal pad.

8. A method for fabricating a semiconductor structure comprising:
    forming an insulating layer having a first surface and a second surface opposite the first surface;
    forming a thermal insulating element extending vertically through the insulating layer from the first surface to the second surface, the thermal insulating element and the insulating layer comprising different insulating materials and the thermal insulating element comprising a thermal insulating material;
    forming a first conductor on the second surface of the insulating layer and immediately adjacent to the thermal insulating element, the forming of the first conductor being performed such that the thermal insulating element is narrower in width than the first conductor;
    forming a solder bump on the first conductor;
    forming a second conductor extending vertically through the insulating layer from the first surface to the second surface such that second conductor is immediately adjacent to the insulating layer, such that a portion of the insulating layer is positioned laterally between the second conductor and the thermal insulating element and such that, after the forming of the first conductor, the second conductor is also immediately adjacent to the first conductor; and,
    before the forming of the insulating layer, forming a third conductor,
    the insulating layer, the thermal insulating element, and the second conductor being formed following formation of the third conductor such that the third conductor is on the first surface of the insulating layer and immediately adjacent to the thermal insulating element and the second conductor,
    the thermal insulating element reducing thermal energy transfer during a chip-join process from the solder bump to a metal level included in the semiconductor structure.

9. The method of claim 8, the thermal insulating material at least one of air, airgel, and solgel.

10. The method of claim 8, the thermal insulating element comprising a structural support element.

11. The method of claim 8, further comprising:
    before the forming of the solder bump, forming a conductive liner on the first conductor such that the thermal insulating element and an interface between the conductive liner and the first conductor have approximately equal widths.

12. The method of claim 8, wherein the semiconductor structure uses induction heating during fabrication.

13. The method of claim 12, wherein the induction heating occurs for 20 seconds or less.

14. The method of claim 8, the first conductor comprising a terminal metal pad.

15. A semiconductor structure comprising:
    an insulating layer having a first surface and a second surface opposite the first surface;
    a thermal insulating element extending vertically through the insulating layer from the first surface to the second surface, the thermal insulating element and the insulating layer comprising different insulating materials and the thermal insulating element comprising a thermal insulating material;
    a first conductor on the second surface of the insulating layer and immediately adjacent to the thermal insulating element;
    a solder bump on the first conductor;
    a plurality of second conductors extending vertically through the insulating layer from the first surface to the second surface, the second conductors being immediately adjacent to the first conductor and further being positioned laterally adjacent to the thermal insulating element; and
    a third conductor on the first surface of the insulating layer and immediately adjacent to the thermal insulating element and the second conductors,
    the thermal insulating element reducing thermal energy transfer during a chip-join process from the solder bump to a metal level in the semiconductor structure,
    the thermal insulating element being narrower in width than the first conductor and the third conductor and being center aligned with the first conductor and the third conductor, and the second conductors being adjacent to opposite sides of the thermal insulating element.

16. The semiconductor structure of claim 15, the second conductors being on adjacent to one side of the thermal insulating element.

17. The semiconductor structure of claim 15, the insulating layer comprising a semiconductor oxide layer.

18. The semiconductor structure of claim 15, the thermal insulating material comprising at least one of air, airgel, and solgel.

19. The semiconductor structure of claim 15, the thermal insulating element comprising a structural support element.

* * * * *